(12) United States Patent  
Phaowongsa et al.

(10) Patent No.: US 7,572,168 B1
(45) Date of Patent: Aug. 11, 2009

(54) METHOD AND APPARATUS FOR HIGH SPEED SINGULATION

(75) Inventors: Apichart Phaowongsa, Samutprakam (TH); Somchai Nondhasitthichai, Bangna Bangkok (TH); Charun Sae-lee, Kongtun Kontoey Bangkok (TH); Praphan Sararat, Wangnumyen Sakaeo (TH)

(73) Assignee: UTAC Thai Limited, Bangna, Bangkok (TH)

( * ) Notice: Subject to any disclaimer, the term of this patent is extended or adjusted under 35 U.S.C. 154(b) by 133 days.

(21) Appl. No.: 11/717,912

(22) Filed: Mar. 13, 2007

Related U.S. Application Data

(60) Provisional application No. 60/792,093, filed on Apr. 13, 2006.

(51) Int. Cl.
    *B24B 49/00*     (2006.01)
    *B28D 1/04*      (2006.01)
(52) U.S. Cl. ........................................ 451/7; 125/13.01
(58) Field of Classification Search ............... 451/7; 125/13.01
    See application file for complete search history.

(56) References Cited

U.S. PATENT DOCUMENTS

| | | | | |
|---|---|---|---|---|
| 3,169,923 | A * | 2/1965 | Latos et al. | 508/431 |
| 3,203,895 | A * | 8/1965 | Guarnaccio et al. | 508/431 |
| 3,611,061 | A | 10/1971 | Segerson | 317/234 R |
| 4,801,561 | A | 1/1989 | Sankhagowit | 437/207 |
| 5,372,220 | A * | 12/1994 | Jacobs et al. | 184/6.14 |
| 5,396,185 | A | 3/1995 | Honma et al. | 324/754 |
| 5,832,585 | A * | 11/1998 | Takiar et al. | 125/16.02 |
| 5,923,995 | A * | 7/1999 | Kao et al. | 438/460 |
| 6,304,000 | B1 | 10/2001 | Isshiki et al. | 257/782 |
| 6,386,948 | B1 * | 5/2002 | Kondo | 451/28 |
| 6,428,883 | B1 * | 8/2002 | White | 428/323 |
| 6,521,513 | B1 * | 2/2003 | Lebens et al. | 438/462 |
| 6,902,469 | B2 * | 6/2005 | Kondo et al. | 451/44 |
| 7,008,825 | B1 | 3/2006 | Bancod et al. | 438/123 |
| 7,281,535 | B2 * | 10/2007 | Mihai et al. | 125/13.01 |
| 2005/0056135 | A1 * | 3/2005 | Hall et al. | 83/851 |
| 2005/0268899 | A1 * | 12/2005 | Mihia et al. | 125/13.01 |
| 2007/0175304 | A1 * | 8/2007 | In't Veld et al. | 83/169 |

* cited by examiner

*Primary Examiner*—Maurina Rachuba
(74) *Attorney, Agent, or Firm*—Haverstock & Owens LLP

(57) ABSTRACT

A method of singulating semiconductor devices applies a blade to a molded strip that includes the semiconductor device. The blade generates a kerf at a contact point between the blade and the molded strip. The kerf is filled with a plurality of particles. The kerf separates the semiconductor device from the molded strip. The method cools the blade by using a synthetic lubricant. The method lubricates the blade by using the synthetic lubricant. The method rinses the kerf by using the synthetic lubricant. Rinsing the kerf removes a substantial quantity of the particles from the kerf. A system singulates semiconductor devices from a molded strip by using a blade, a temperature control device, and a synthetic lubricant. The blade singulates the semiconductor device from the molded strip. The temperature control device applies the synthetic lubricant to the blade. The synthetic lubricant cools, lubricates, or rinses the blade, or a combination thereof, during a singulation process.

37 Claims, 9 Drawing Sheets

METHOD AND APPARATUS FOR HIGH SPEED SINGULATION

RELATED APPLICATIONS

The present application claims priority to U.S. Provisional Patent Application 60/792,093, filed on Apr. 13, 2006, and entitled "Method and Apparatus for High Speed Singulation" to the same inventors under U.S.C. section 119(e). This application incorporates U.S. Provisional Patent Application 60/792,093, filed on Apr. 13, 2006, and entitled "Method and Apparatus for High Speed Singulation" to the same inventor by reference in its entirety.

FIELD OF THE INVENTION

The present invention is related to the field of semiconductor device manufacturing. More specifically, the present invention relates to high speed singulation for semiconductor devices.

BACKGROUND

The manufacture of semiconductor integrated circuits has become a competitive, high volume commodity business. As such, controlling the cost of each completed circuit improves the commercial effectiveness of that circuit. For the semiconductor manufacturing industry, the time necessary to complete each manufacturing step has a direct relationship and effect on the cost of that circuit. One time-consuming phase during the fabrication of semiconductor devices is singulation. Singulation is a process for dicing a sheet of fabricated semiconductor die and/or packages into individual units. Semiconductor dice are typically mass produced on a wafer and good dice are mounted on a leadframe. The leadframes are also typically mass produced in large batches by the sheet. Depending on the manufacturing process, the sheet of leadframes can have an adhesive (dicing) tape applied to one side of the sheet before an encapsulation is applied to the dice mounted on the leadframes. The encapsulation is typically performed by molding a plastic resin to the sheet of dice and leadframes. In these cases, the dicing tape provides a lower support structure for the formation of the plastic molding during encapsulation. The encapsulation is commonly referred to as a semiconductor package.

A singulation process separates each package from the molded sheet. The molded sheet is typically divided into molded strips for singulation. There are various techniques currently being practiced for singulation. One technique involves punching, while another technique involves sawing the molded strip to separate the packages from the molded strip. Two particular drawbacks related to sawing the molded strip are (1) lengthy singulation times and (2) defects in the singulated product. Both drawbacks are related to the heat generated by the singulation blade. The saw blade cuts the resin and can cut the lead frame into a plurality of particles. While cutting, the blade forms a well-known trench-like kerf. The kerf can fill with particles which can bind between the blade and a wall of the kerf. The particles can damage the wall of the kerf leading to failures or reliability problems.

In a conventional process, the singulation blade is generally operated at a rotational (spindle) speed of 20,000 rotations per minute (RPM), and a table speed of two inches per second (IPS). These speeds are typical of a conventional "Disco" type singulation machine. As is commonly understood in the art, the table speed measures the (linear) speed of the blade moving along a molded strip during singulation of the molded strip, whereas the spindle speed approximates the rotational speed of the blade (about its axis), as the blade cuts through the molded strip.

The relatively slow conventional speeds are used in the art to reduce blade overheating, to preserve blade life, and to reduce the number of defects in the singulated product. As mentioned above, speeding up the singulation process is beneficial to improve throughput and thereby reduce costs associated with semiconductor manufacturing. While increasing the rotational speed of the blade can promote faster singulation, there are significant tradeoffs in a conventional singulation process. Higher blade speeds increase blade temperature, which results in lower cutting efficiency, higher blade wear, and more singulation defects.

To cool the blade, certain conventional singulation processes use deionized (DI) water. However, simple deionized water does not operate adequately to (1) cool the blade, (2) lubricate the blade, and (3) remove the buildup of particles on and around the blade and in the kerf during singulation, and particularly at higher RPM and/or lateral (IPS) blade movement. Simple deionized water has certain properties that inhibit proper service as a lubricant and coolant. One such property is the high surface tension of water, which causes the water to form high tension beads. The high tension beads do not distribute well over large surface areas, and do not penetrate into small spaces such as the kerf. Hence, the high tension beads do not adequately cool and lubricate high speed singulation blades, and do not properly remove the buildup of particles, which obstruct the blade during singulation. These obstructions lead to higher friction between the blade and the kerf, and the higher friction further causes high power consumption by the electric motor and other components of the blade. Thus, there is a need to accelerate the singulation process without negatively affecting the quality or reliability of the singulated product, or the longevity of useful blade life.

SUMMARY OF THE INVENTION

Some embodiments of the invention disclose a method of singulation for a semiconductor device. The method applies a blade to a molded strip that includes the semiconductor device. The blade generates a kerf at a contact point between the blade and the molded strip. The kerf has a plurality of particles cut by the blade. The kerf separates the semiconductor dice from each other. The method cools the blade by using a synthetic lubricant. The method lubricates the blade by using the synthetic lubricant or a combination of DI water and the synthetic lubricant. Hereafter, synthetic lubricant is meant to include the synthetic lubricant (and/or coolant) and a combination thereof with water. The method rinses the kerf by using the synthetic lubricant. Rinsing the kerf removes a substantial quantity of the particles from the kerf.

Preferably, the blade moves at a high rate of speed, such as, for instance, at a spindle speed of approximately 30,000 to 50,000 rotations per minute, and/or at a table speed of approximately 4-10 inches per minute. By lubricating the blade, the method substantially reduces the coefficient of friction between the blade and the kerf. The method typically cools the blade by directing the synthetic lubricant toward the blade, such that the temperature of the blade is substantially reduced. Moreover, the power consumed from the blade's operation is substantially reduced, such as, for instance, from 3.5 Amps to about 1.9 Amps, in some embodiments.

Rinsing the kerf typically comprises injecting the synthetic lubricant into the kerf.

For certain embodiments, the semiconductor device includes a die and/or leadframe. The molded strip of various embodiments includes a plurality of semiconductor packages. Often, the molded strip further has a dicing tape attached to a side of the molded strip.

Some embodiments of the invention provide a system for singulation of a semiconductor device. The system comprises a molded strip, a blade, a temperature control device, and a synthetic lubricant. The molded strip has a plurality of semiconductor devices. The blade is for singulating the semiconductor device from the molded strip. When the blade contacts the molded strip, the blade generates a kerf. The kerf has a plurality of particles. The temperature control device is configured to apply the synthetic lubricant to the blade. The synthetic lubricant cools the blade and lubricates the blade during a singulation process.

As mentioned above, the blade moves and/or rotates at a high rate of speed. The synthetic lubricant often substantially reduces the coefficient of friction between the blade and the kerf and/or substantially reduces the temperature of the blade. Moreover, the blade consumes less power. In some instances, the power consumption is about 1.9 Amps. The temperature control device of some embodiments further comprises a nozzle for directing the synthetic lubricant toward the blade. The nozzle of some embodiments injects the synthetic lubricant into the kerf. In these cases, the synthetic lubricant typically enters the kerf and substantially removes the particles from the kerf.

Some systems further include a dicing tape. The semiconductor devices of these systems are typically attached to the dicing tape. The semiconductor device of some embodiments comprises a die and/or leadframe and the molded strip often has one or more semiconductor packages thereon. These semiconductor packages typically include a leadframe, a semiconductor die coupled to the lead frame, and a capsule enclosing the semiconductor die. The leadframe of some embodiments comprises an alloy.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form to not obscure the description of the invention with unnecessary detail.

Figure 1:
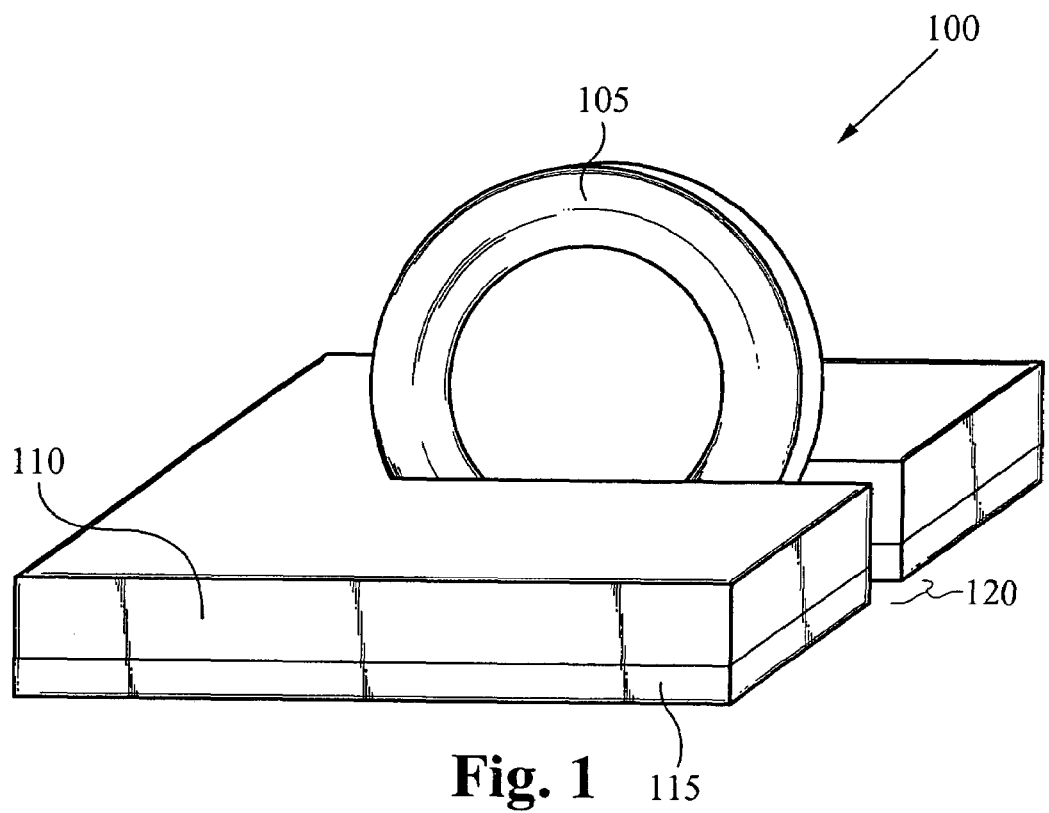
FIG. 1 is an illustration of an apparatus for semiconductor device singulation.

FIG. 1 is an illustration of a system for semiconductor device singulation. As shown in this figure, the system 100 includes a singulation blade 105, a molded strip 110, a dicing tape 115, and a kerf 120. The molded strip 110 typically includes a number of semiconductor devices that are fabricated on sheets comprising various combinations of metal, semiconductor, and molding material. The sheets of different fabrication processes and with different die have various sizes and shapes before the sheets are diced by a singulation process to yield the individual semiconductor devices. The dicing tape 115 is typically an adhesive (dicing) tape that is used in the fabrication process.

During the singulation process, the blade 105 is applied to the molded strip 110. When applied to the molded strip, the blade 105 typically cuts into or through the molded strip 110, which generates the kerf 120. The kerf 120 has substantially parallel walls cut into the molded strip, spaced apart from each other approximately the thickness of the blade. Preferably, the blade 105 rotates at a high rate of speed. In some embodiments, the spindle speed of the blade 105 is approximately 30,000 to 50,000 rotations per minute (RPM), while in some embodiments the table speed is approximately 4-10 inches per second (IPS). Without the invention, cutting the molded strip 110, generation of the kerf 120 and the high speed rotation of the blade would cause a number of undesirable effects. For instance, high speed rotation of the blade 105 would cause the blade 105 to undesirably reach a higher temperature. An overheated blade 105 would cause (1) premature wear on the blade and (2) undesirable defects in the singulated product.

Moreover, generation of the kerf 120 produces a large amount of loose sawed particles, which, without the invention, would come to rest within the kerf 120. The particles within the kerf 120 can increase the coefficient of friction of the blade 105 against the walls of the kerf 120, and increase the power consumed to operate the blade 105, while lowering the rate of cutting through the molded strip 110 and the dicing tape 115. Also, particles can get caught and bind between the blade 105 and the walls of the kerf 120. The increased friction on the blade 105 and the longer cutting time, further increase the temperature of the blade 105, and thus exasperate the problems caused by an overheated blade: (1) premature blade wear and (2) defects in the singulated product.

Figure 2:
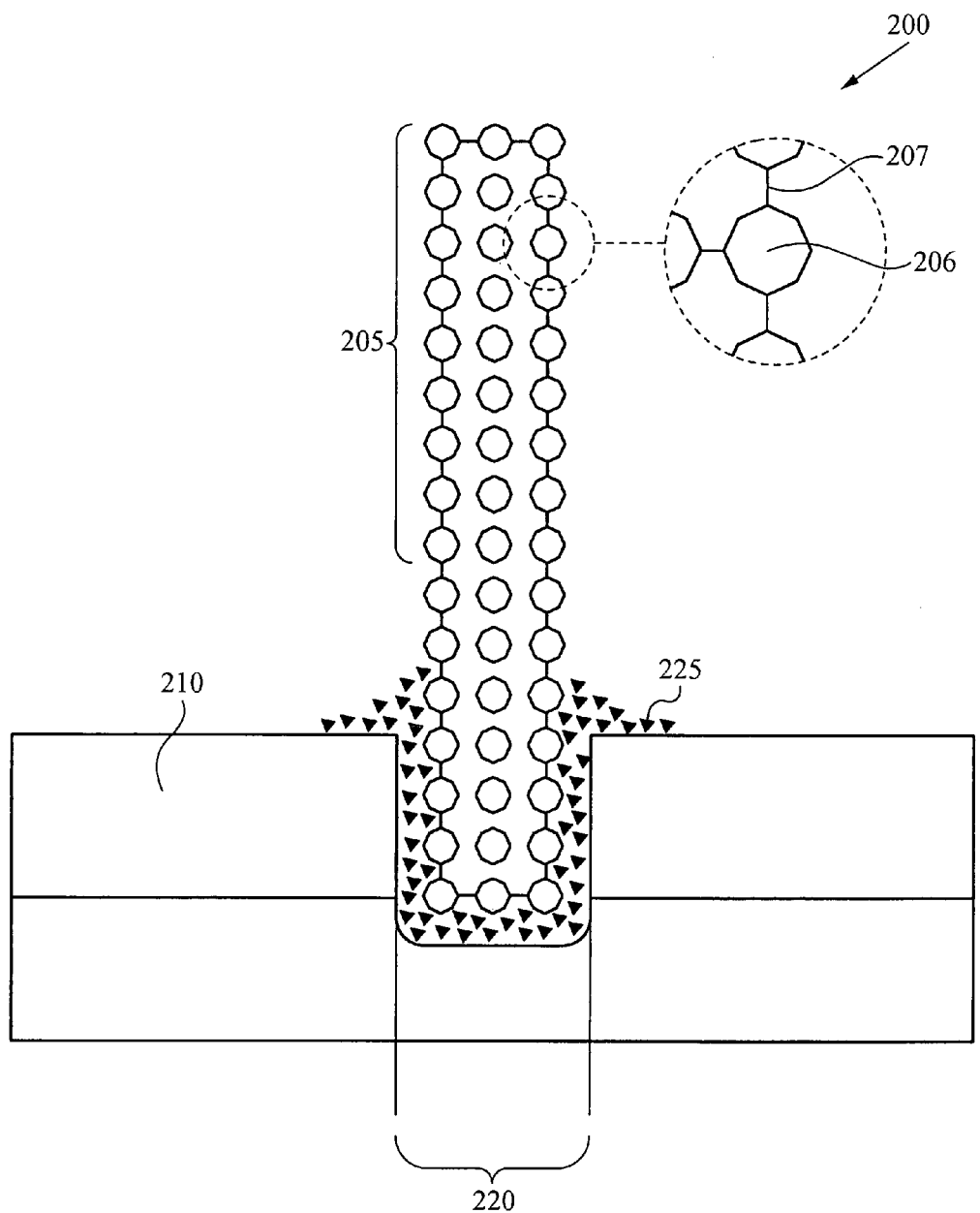
FIG. 2 illustrates a singulation process.
Figure 3:
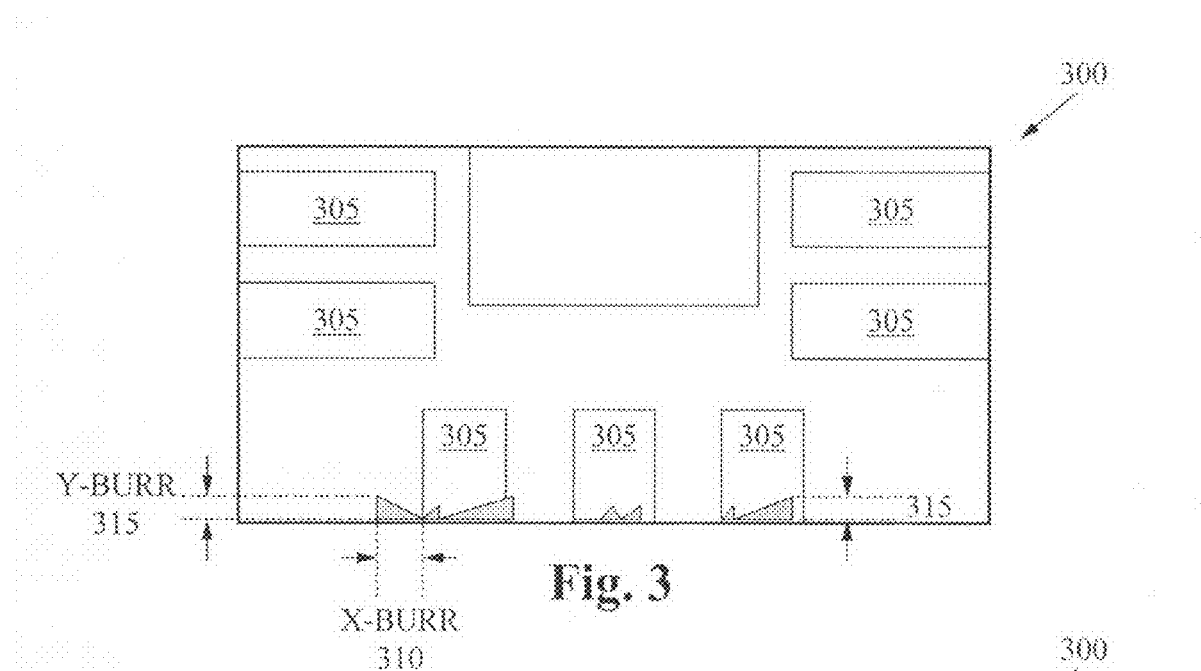
FIG. 3 illustrates a burr caused by a singulation process.
Figure 4:
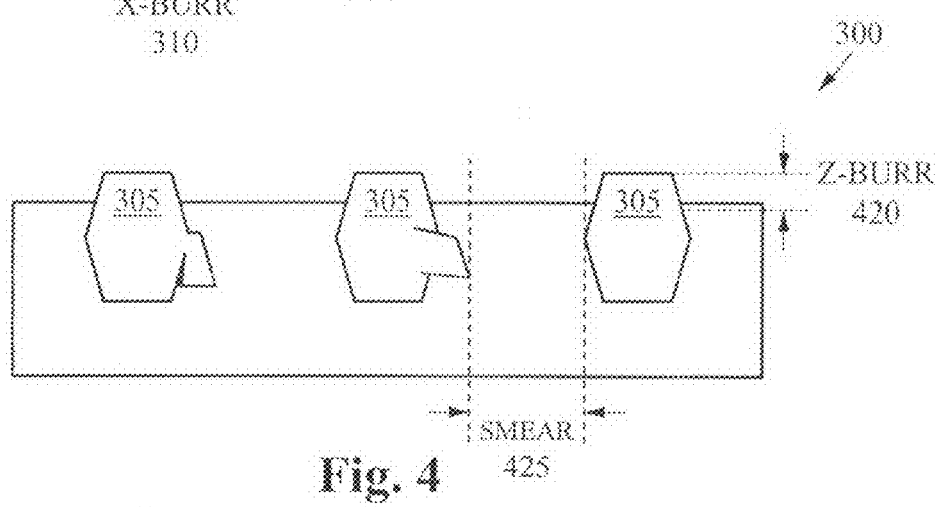
FIG. 4 illustrates a smear caused by a singulation process.
Figure 5:
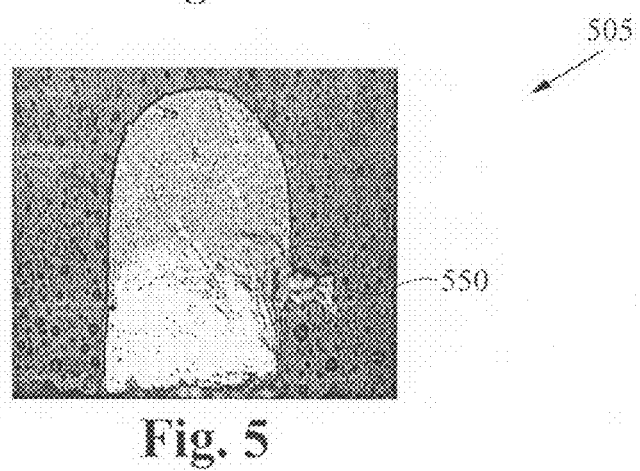
FIG. 5 shows a solder melt caused by a singulation process.

FIG. 2 illustrates a closer view of the system 200 during a singulation process. As shown in FIG. 2, the blade 205 of some embodiments is comprised of several grits 206 secured by a resin 207. The grits 206 are typically formed out of diamond or another suitable substance. As the grits 206 contact the molded strip 210, a number of loose sawed particles 225 undesirably accumulate in the kerf 220, which undesirably degrades the cutting efficiency of the blade 205. As mentioned above, the application of the blade 205 in the kerf 220 typically generates an undesirable amount of heat that can cause several types of defects in the singulated product. FIGS. 3, 4 and 5 illustrate examples of some of these defects.

For instance, FIG. 3 illustrates a burr caused by a singulation process. As shown in this figure, a lead frame 300 has several leads 305. The lead frame 300 has undergone a singulation process in which undesirable particles in the kerf and an overheated blade has caused the burrs 310 and 315 in the leads 305 on a side of the leadframe 300. Also illustrated in this figure, the burrs are caused in one or more directions, for example, the X-direction 310 and/or the Y-direction 315. A Z-direction burr 420, is illustrated in FIG. 4. FIG. 4 presents a side view of the leads 305 of the lead frame 300. FIG. 4 also illustrates a smear 425 between the leads 305 of the leadframe 300 caused by a singulation process. As shown in this figure, the smear 425 brings the leads 305 of the leadframe 300 undesirably near each other.

FIG. 5 shows a solder melt caused by a singulation process. As shown in this figure, the lead 505 of a leadframe has an undesirable solder melt 550 that has oozed beyond the boundary of the lead 505. As mentioned above, the solder melt 550 is often caused by an overheated blade.

Figure 6:
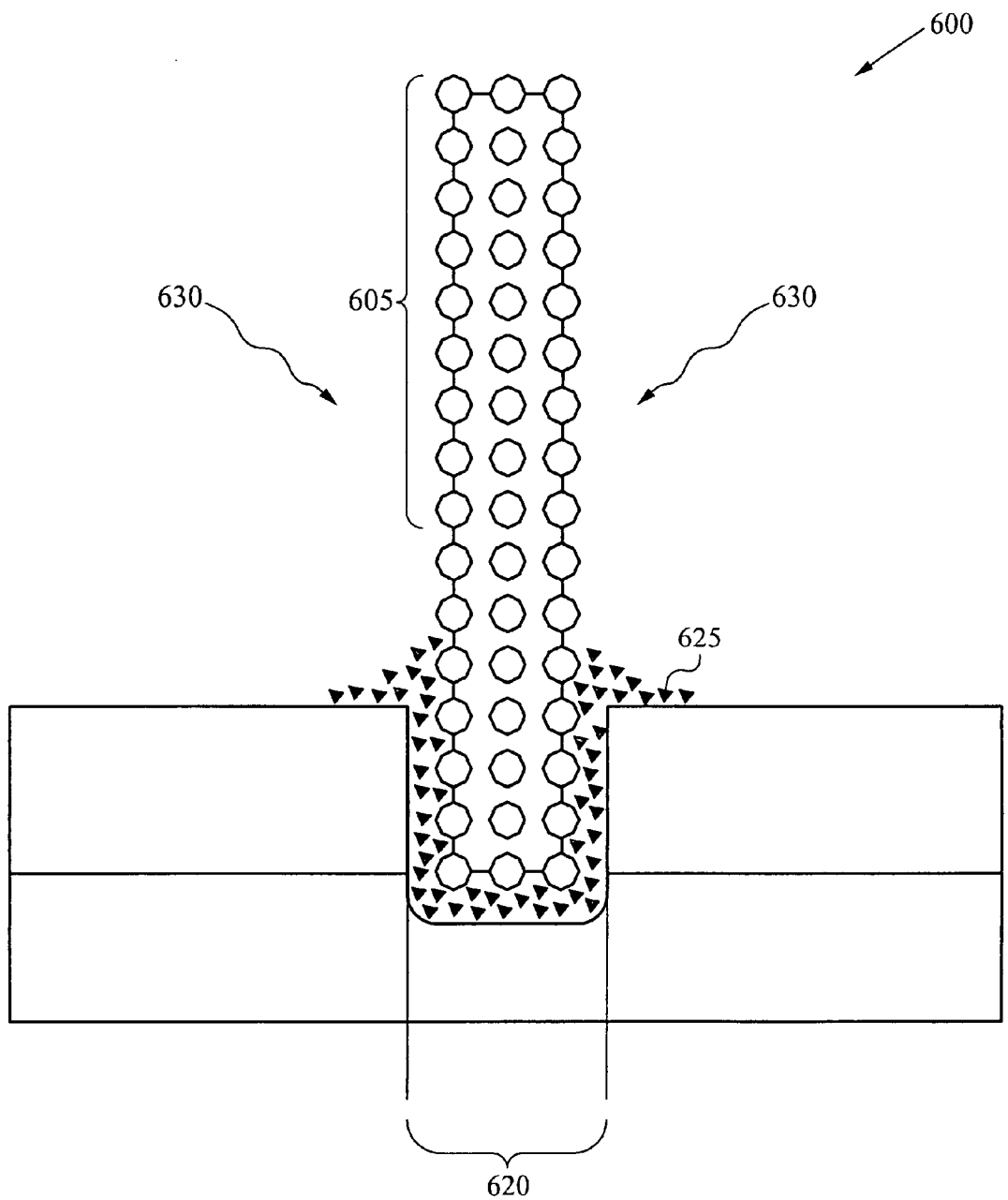
FIG. 6 illustrates cooling a singulation blade with deionized water.

Also mentioned above, various attempts have been made to cool the blade. FIG. 6 illustrates a system 600, which attempts to cool a singulation blade 605 with deionized water 630. However, as shown in this figure, deionized water does not operate adequately to (1) cool the blade 605, particularly at higher spindle and/or table speeds, (2) lubricate the blade 605, and (3) remove the buildup of particles 625 from the kerf 620.

Figure 7:
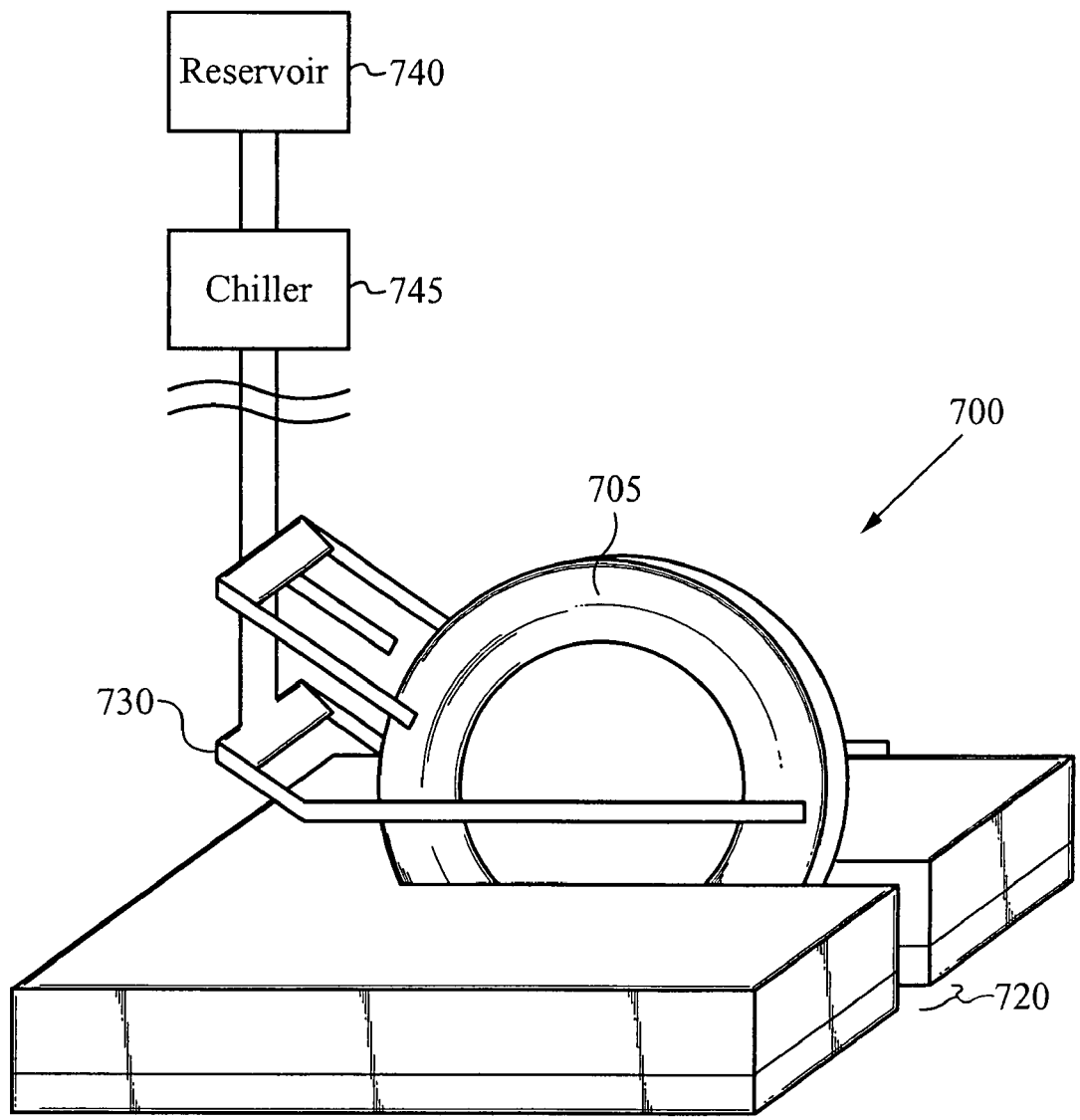
FIG. 7 illustrates a singulation blade generating a kerf in a molded strip in accordance with some embodiments of the invention.

Accordingly, FIG. 7 illustrates a system 700 for cooling and lubricating a singulation blade 705, and rinsing a kerf 720, with a temperature control device 730 and a synthetic lubricant according to some embodiments of the invention. As shown in FIG. 7, the temperature control device 730 is coupled to a chiller module 745, which is coupled to a reservoir 740. The reservoir 740 typically stores a fluid, such as, for example, the synthetic lubricant, distilled water, and/or a combination thereof. The chiller module 745 receives the synthetic lubricant or other fluid from the reservoir 740, and chills or cools it. Some embodiments cool the synthetic lubricant to a temperature of approximately 20 degrees Celsius. However, other temperatures, including cooler temperatures, are achieved by the chiller module 745. As the chiller module 745 cools the synthetic lubricant, the blade 705 typically generates a kerf 720 in a molded strip. While the kerf 720 is generated, the temperature control device 730 directs the cooled synthetic lubricant in particular ways.

Figure 8:
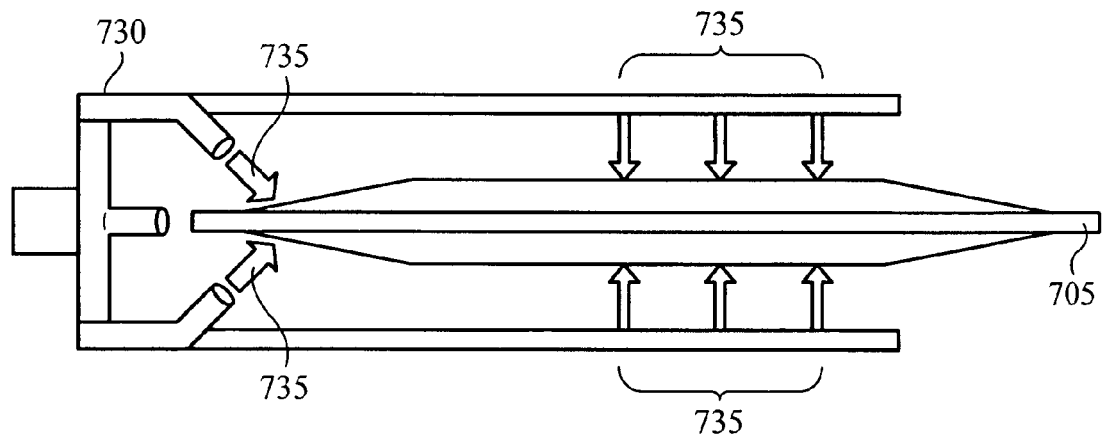
FIG. 8 illustrates cooling and lubricating a singulation blade, and rinsing a kerf, with a synthetic lubricant according to some embodiments of the invention.

FIG. 8 illustrates a top view of the operation of the temperature control device 730, according to some embodiments. As shown in this figure, the temperature control device 730 of these embodiments applies a synthetic lubricant 735 towards several locations of the blade 705, as well as directly at the cutting locus of the blade 705. Further the temperature control device 730 injects the synthetic lubricant 735 directly into the kerf 720. To accomplish the multi-point and/or multi-stage delivery of the synthetic lubricant 735, the temperature control device 730, of some embodiments, employs one or more nozzles for directing the synthetic lubricant 735. The application method of these embodiments, achieves superior results over the art.

Figure 9:
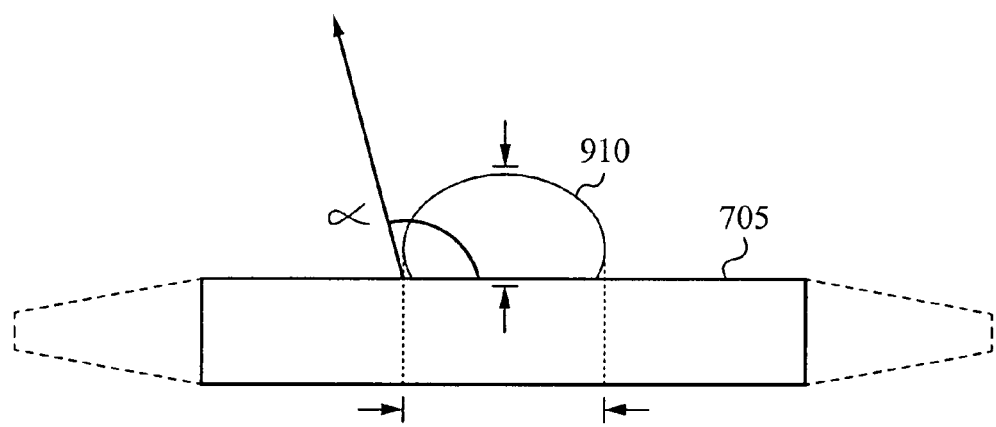
FIG. 9 compares the surface tension of deionized water with the surface tension of a synthetic lubricant.
Figure 9:
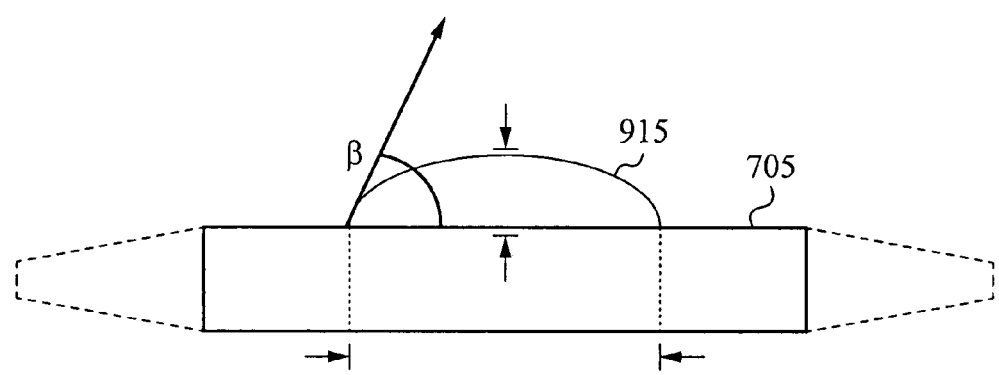

Moreover, the properties of the synthetic lubricant has superior properties over conventionally used deionized water for cooling and lubricating the blade, and for flushing the kerf. For example, FIG. 9 compares the surface tension of deionized water with the surface tension of a synthetic lubricant. As shown in this figure, the deionized water tends to form a high tension bead 910 on a surface of the blade 705. The high tension bead 910 forms a large bead angle (alpha), which prevents the deionized water from distributing over a greater surface of the blade 705. Further, the high tension bead 910 has a high profile with respect to the surface of the blade 705 and, thus, does not penetrate between the blade 705 and the loose particles in the kerf. As further shown in this figure, the synthetic lubricant 915 has a lower surface tension than the deionized water and the synthetic lubricant 915 is distributed at a lower angle (beta) over a broader surface of the blade 705. Thus, the synthetic lubricant covers a greater surface area and enters tighter regions formed between the blade and the loose particles within the kerf.

EXPERIMENTAL RESULTS

Figure 10:
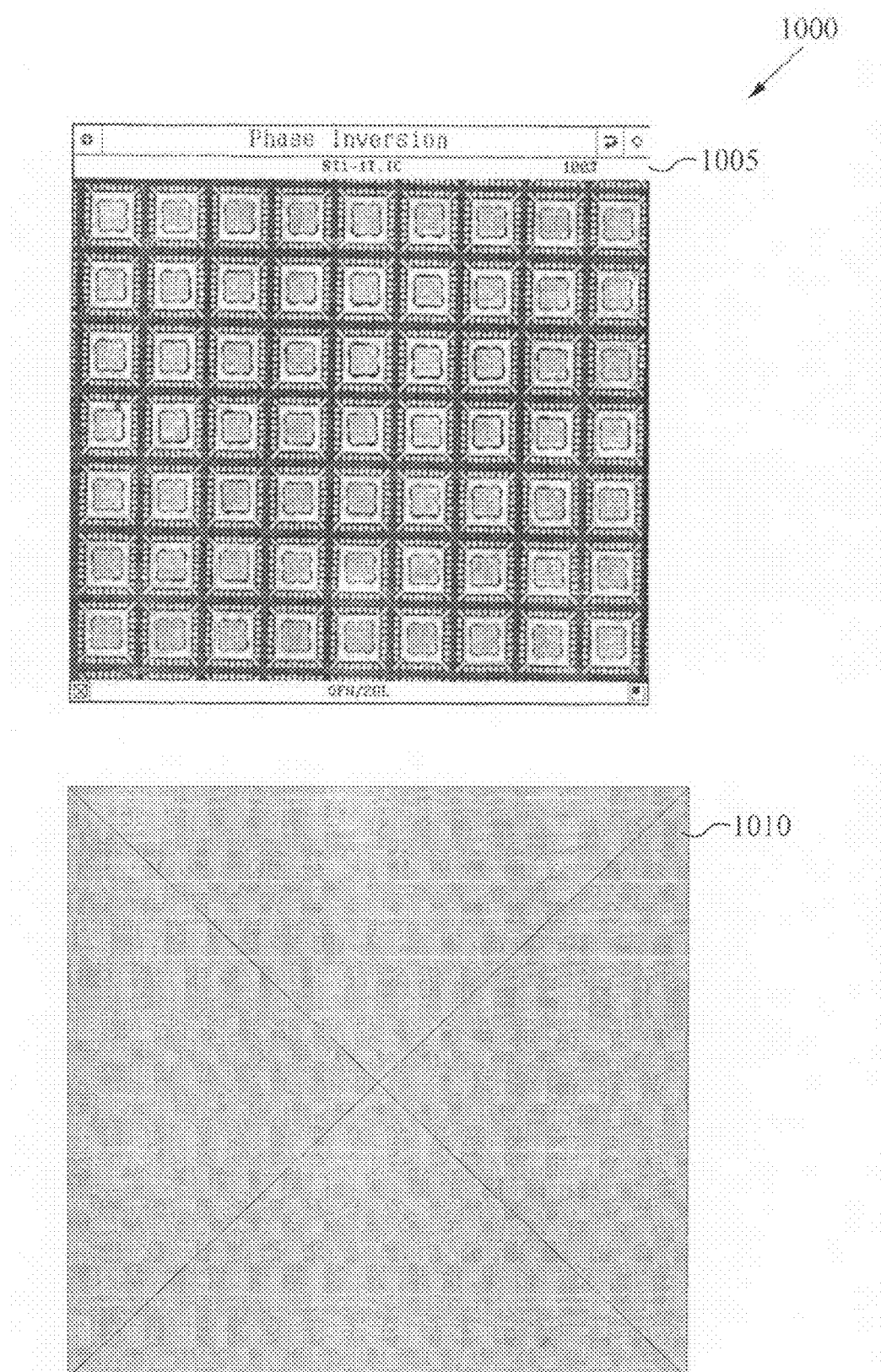
FIG. 10 presents the results of a delamination test immediately after singulation.

Several experiments were conducted to determine the efficacy of the method and system employing the synthetic lubricant of the embodiments described above. FIG. 10 presents the results 1000 of a delamination test immediately after singulation. The results 1000 presented in this figure compare a high speed singulation process 1010 versus a conventional singulation process 1005. As shown in this figure, the products of the high speed singulation process 1010 exhibit no incidences of singulation defects over the conventional lower speed process 1005. However, the high speed singulation process 1010 is performed at a blade spindle rotation rate of approximately 30,000 to 50,000 RPM and/or a table speed of approximately 4 to 10 IPS. Moreover, the blade of the embodiments described above draws current of about 1.9 Amps. In contrast, the conventional singulation process draws about 3.5 Amps, while cutting laterally through the molded strip at only about 2.0 IPS, and at a spindle speed of only 20,000 RPM.

Figure 11:
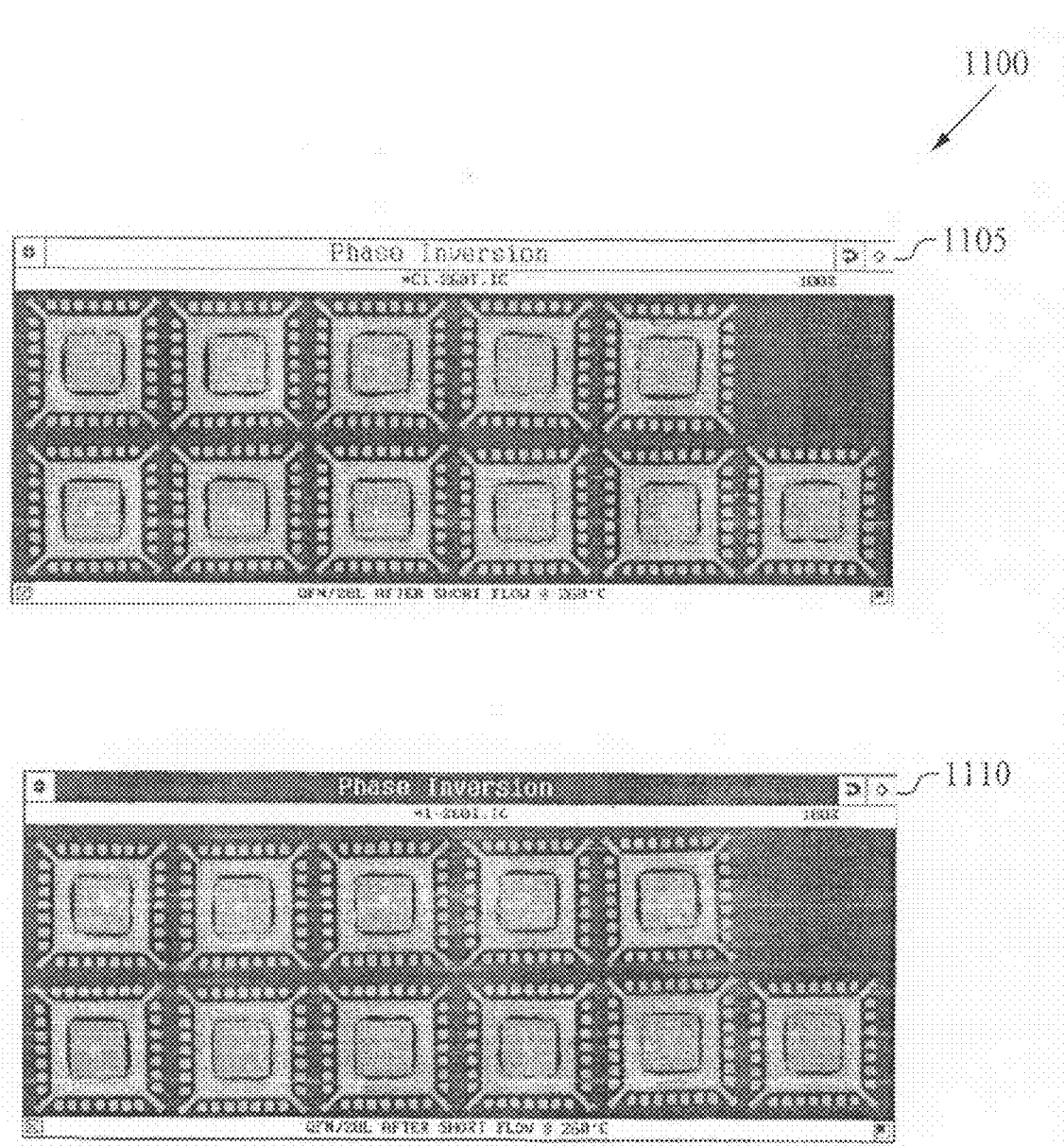
FIG. 11 presents the results of a delamination test after a brief exposure to stress conditions at high heat.

FIG. 11 presents the results 1100 of a delamination test after a brief exposure to high heat stress conditions. The heat stress conditions were applied after singulation by autoclaving at 260° C., 15 psi, 100% relative humidity, then infrared and/or conventional (wire) heating reflow, three times. These results 1100 compare a high speed singulation process 1110 versus a conventional singulation process 1105. As presented in this figure, the high speed singulation process 1110 exhibited no incidences of singulation defects over the conventional singulation process 1105, despite operating at a higher speed.

Figure 12:
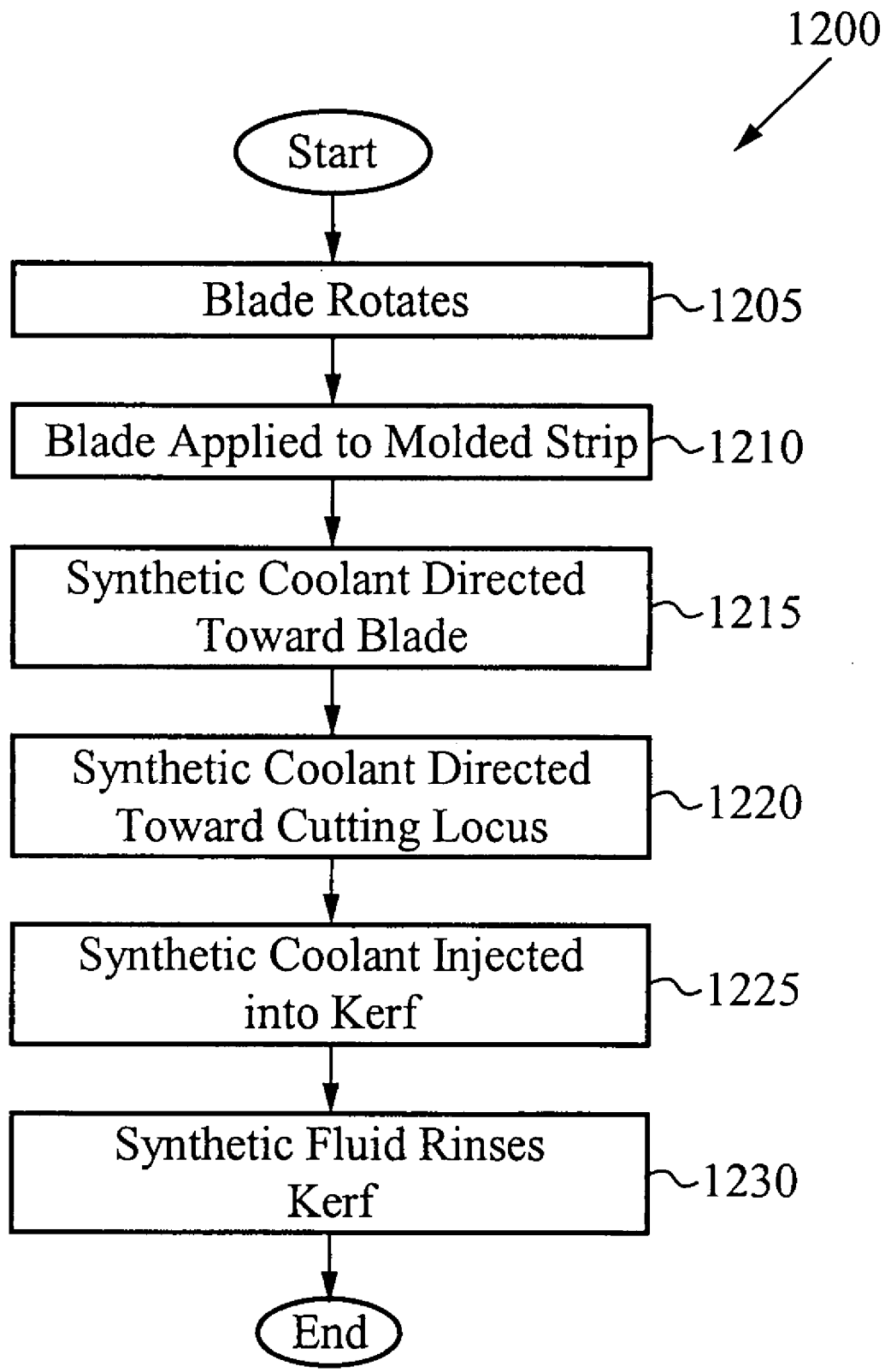
FIG. 12 illustrates a high speed singulation process according to some embodiments of the invention.

FIG. 12 summarizes the high speed singulation process 1200 of some embodiments of the invention. As shown in this figure, the process 1200 begins at the step 1205, where the blade rotates at a high RPM. As mentioned above, the blade of some embodiments rotates at a spindle speed of approximately 30,000 to 50,000 RPM, and/or cuts at table speed of 4-10 IPS. However, one of ordinary skill will recognize that higher blade speeds are achieved by additional embodiments. Next, at the step 1210, the blade is applied to a molded strip that has one or more semiconductor devices on the molded strip. Then, at the step 1215, the synthetic lubricant is directed toward the blade. The synthetic lubricant will tend to cool the blade. At the step 1220, the synthetic fluid is directed toward the cutting locus of the blade to lubricate the blade. The improved blade lubrication lowers the coefficient of friction between the blade and the cutting locus, which further lowers the temperature of the blade, and/or power consumption. In some embodiments, the overall power consumption is from 3.5 Amps to about 1.9 Amps. Next, at the step 1225, some embodiments inject the synthetic lubricant directly into the kerf. This tends to loosen the sawed particles in the kerf. At the step 1230, the synthetic lubricant further acts to rinse the kerf of the particles. Then, the process 1200 concludes.

ADVANTAGES

As described above, some embodiments of the invention provide a method and system for using a synthetic lubricant in a singulation process. The combination of an appropriate synthetic lubricant and an effective cooling device, together with a process for applying the device and lubricant, overcomes the drawbacks of high temperature and blade wear rate. For instance, the cooler running blade reduces metal fatigue and extends the effective cutting efficiency and useful life of the blade. Additionally, the cooler running blade typically operates at higher rotations per minute (RPM) and/or inches per second (IPS), in terms of spindle and/or table speeds, which results in faster and more efficient singulation for semiconductor fabrication. The result is a higher throughput than the conventional singulation process without a tradeoff in the quality of the singulated product.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A method of singulation for a semiconductor device, the method comprising:
   applying a blade to a molded strip comprising the semiconductor device, wherein the blade generates a kerf at a contact point between the blade and the molded strip, the kerf having a plurality of particles, wherein the kerf separates the semiconductor device from the molded strip;
   cooling a synthetic lubricant by a chiller;
   controlling application of the cooled synthetic lubricant to at least two application points by use of a temperature control device coupled to the chiller;
   cooling and lubricating the blade at a first application point by directing the cooled synthetic lubricant to the first application point, wherein said first application point is the contact point;
   cooling, lubricating and rinsing particles from a second application point by directing cooled synthetic lubricant into the second application point, wherein said second application point is the kerf, wherein rinsing the kerf removes a substantial quantity of the particles from the kerf.

2. The method of claim 1, further comprising rotating the blade at a high rate of speed.

3. The method of claim 2, wherein the high rate of speed comprises a spindle speed of approximately 30,000 to 50,000 rotations per minute.

4. The method of claim 1, wherein lubricating the blade substantially reduces the coefficient of friction between the blade and the kerf.

5. The method of claim 1, wherein cooling and lubricating the blade comprises directing the cooled synthetic lubricant to at least a third application point, wherein the third application point is, and any further application points are, distinct from the first and second applications points, such that the temperature of the blade is substantially reduced.

6. The method of claim 1, wherein operation of the blade consumes less power.

7. The method of claim 6, wherein the blade draws current approximately in the range of 1.9 to 3.5 Amps.

8. The method of claim 1, wherein rinsing the kerf comprises injecting the synthetic lubricant into the kerf.

9. The method of claim 1, wherein the synthetic lubricant is used in conjunction with de-ionized water.

10. The method of claim 1, wherein the semiconductor device comprises a leadframe.

11. The method of claim 1, wherein the molded strip comprises a plurality of semiconductor packages.

12. The method of claim 1, wherein the molded strip further comprises a tape.

13. A system for singulation of a semiconductor device from a molded strip having a plurality of semiconductor devices, the system comprising:
    a blade for singulating the semiconductor device from the molded strip, wherein when the blade contacts the molded strip, the blade generates a kerf at a contact point between the blade and the molded strip, the kerf having a plurality of particles, wherein the kerf separates the semiconductor device from the molded strip;
    a synthetic lubricant;
    a temperature control device;
    a chiller module for cooling the synthetic lubricant;
    wherein the temperature control device is coupled to the chiller module, the temperature control device is configured to apply the cooled synthetic lubricant to a first application point by directing cooled synthetic lubricant to the first application point, wherein said first application point is the contact point; and
    cooling, lubricating and rinsing particles from a second application point by directing cooled synthetic lubricant into the second application point, wherein said second application point is the kerf.

14. The system of claim 13, wherein the blade cuts at a high rate of speed.

15. The system of claim 14, wherein the high rate of speed comprises a spindle speed of approximately 30,000 to 50,000 rotations per minute.

16. The system of claim 14, wherein the high rate of speed comprises a table speed of approximately 4 to 10 inches per second.

17. The system of claim 13, wherein the synthetic lubricant substantially reduces the coefficient of friction between the blade and the kerf.

18. The system of claim 13, wherein the synthetic lubricant substantially reduces the temperature of the blade.

19. The system of claim 13, wherein the current drawn for the operation of the blade is in the range of about 1.9 to 3.5 Amps.

20. The system of claim 13, wherein the temperature control device further comprises a nozzle for directing the synthetic lubricant toward the blade.

21. The system of claim 20, wherein the nozzle injects the synthetic lubricant into the kerf, wherein the synthetic lubricant enters the kerf and substantially removes the particles from the kerf.

22. The system of claim 13, wherein the synthetic lubricant is used in conjunction with de-ionized water.

23. The system of claim 13, further comprising a tape, wherein the semiconductor devices are attached to the tape.

24. The system of claim 13, wherein the semiconductor device comprises a leadframe.

25. The system of claim 13, wherein the molded strip comprises a semiconductor package.

26. The system of claim 25, wherein the semiconductor package comprises:
    a leadframe;
    a semiconductor die coupled to the lead frame;
    a capsule enclosing the semiconductor die.

27. The system of claim 26, wherein the leadframe comprises an alloy.

28. A semiconductor package comprising:
    a leadframe for providing a set of connections to an exterior of the package;

an encapsulation enclosing at least a portion of the leadframe, wherein the package is formed by singulating the package from a molded strip of packages; wherein the singulation of the package from the molded strip comprises a high speed singulation process, the high speed singulation process including applying a blade to the molded strip of packages at a high speed, wherein the high speed includes at least one of:
(i) a blade having a spindle speed of approximately 30,000 to 50,000 rotations per minute, and
(ii) a table speed of approximately 4 to 10 inches per minute, wherein the blade generates a kerf at a contact point between the blade and the molded strip, the kerf having a plurality of particles;

a synthetic lubricant;

cooling the synthetic lubricant by a chiller;

controlling application of the cooled synthetic lubricant to at least three application points by use of a temperature control device coupled to the chiller;

cooling and lubricating the blade at a first application point by directing the cooled synthetic lubricant to the first application point, wherein said first application point is the contact point;

cooling, lubricating and rinsing particles from a second application point by directing cooled synthetic lubricant into the second application point, wherein said second application point is the kerf;

cooling and lubricating the blade by directing cooled synthetic lubricant to at least a third application point, wherein the third application point is, and any additional application points are, distinct from the first and second application points, wherein defects in the semiconductor package resulting from the singulation process are reduced as compared to a semiconductor package produced at the same high speed using the cooling and lubricating processes of the prior art.

29. The semiconductor package of claim 28, wherein the high speed singulation process comprises a blade having a spindle speed of approximately 30,000 to 50,000 rotations per minute.

30. The semiconductor package of claim 28, wherein the high speed singulation process comprises a table speed of approximately 4 to 10 inches per minute.

31. The semiconductor package of claim 28, wherein the high speed singulation process comprises power consumption approximately in the range of 1.9 to 3.5 Amperes.

32. The semiconductor package of claim 28, wherein the synthetic lubricant is used in conjunction with de-ionized water.

33. A method of singulation for a semiconductor device, the method comprising:

a. applying a blade to a molded strip comprising the semiconductor device, wherein the blade generates a kerf at a contact point between the blade and the molded strip, the kerf having a plurality of particles, wherein the kerf separates the semiconductor device from the molded strip;
b. storing a synthetic lubricant in a reservoir;
c. cooling the synthetic lubricant received from the reservoir by a chiller;
d. controlling application of the cooled synthetic lubricant to at least three application points by use of a temperature control device coupled to the reservoir and to the chiller;
e. cooling and lubricating the blade at a first application point by directing the cooled synthetic lubricant to the first application point, wherein said first application point is the contact point;
f. cooling, lubricating and rinsing particles from a second application point by directing cooled synthetic lubricant into the second application point, wherein said second application point is the kerf;
g. cooling and lubricating the blade by directing cooled synthetic lubricant to at least a third application point, wherein the third application point is, and any additional application points are, distinct from the first and second application points;
wherein the blade is operated at a high rate of speed, said high rate of speed comprising at least one of:
(i) a spindle speed of approximately 30,000 to 50,000 rotations per minute, and;
(ii) a table speed of approximately 4 to 10 inches per second.

34. The method of singulation for a semiconductor device of claim 33, wherein the third application point is, and any additional application points are, located so as to direct cooled synthetic lubricant toward non-cutting surface area(s) of the blade such that the cooled synthetic lubricant is dispersed over the blade by the high rate of speed of the spindle rotation, thereby cooling the blade and flowing additional cooled synthetic lubricant to the first and second application points providing additional cooling and lubrication to the contact point and additional cooling, lubrication and rinsing of the kerf.

35. The method of singulation for a semiconductor device of claim 34, wherein the at least one third application point is located substantially midway between the cutting edge of the blade and the center of rotation of the blade.

36. The method of singulation as in claim 33, wherein the blade comprises diamond grit.

37. The method of singulation as in claim 33, wherein the cooled synthetic lubricant has a lower surface tension than deionized water.

* * * * *